(12) United States Patent
Ramkumar et al.

(10) Patent No.: US 7,192,839 B1
(45) Date of Patent: Mar. 20, 2007

(54) SEMICONDUCTOR STRUCTURE HAVING ALIGNMENT MARKS WITH SHALLOW TRENCH ISOLATION

(75) Inventors: Krishnaswamy Ramkumar, San Jose, CA (US); Sharmin Sadoughi, Menlo Park, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/848,638

(22) Filed: May 19, 2004

Related U.S. Application Data

(62) Division of application No. 10/321,965, filed on Dec. 17, 2002, now Pat. No. 6,774,452.

(51) Int. Cl.
*H01L 23/544* (2006.01)

(52) U.S. Cl. .................... 438/401; 257/E23.179
(58) Field of Classification Search ........... 438/401, 438/462, 975, FOR. 495; 257/E23.179
See application file for complete search history.

(56) References Cited

U.S. PATENT DOCUMENTS

| | | |
|---|---|---|
| 5,503,962 A | 4/1996 | Caldwell |
| 5,640,053 A | 6/1997 | Caldwell |
| 5,889,335 A * | 3/1999 | Kuroi et al. ................ 257/797 |
| 5,950,093 A | 9/1999 | Wei |
| 5,969,428 A | 10/1999 | Nomura et al. |
| 6,100,158 A * | 8/2000 | Lee et al. ................... 438/401 |
| 6,194,287 B1 | 2/2001 | Jang |
| 6,232,200 B1 | 5/2001 | Chu |
| 6,285,455 B1 | 9/2001 | Shiraishi |
| 6,303,458 B1 | 10/2001 | Zhang et al. |
| 6,346,456 B2 | 2/2002 | Chen |
| 6,368,972 B1 | 4/2002 | Maury et al. |
| 6,383,910 B2 | 5/2002 | Okada et al. |
| 6,440,816 B1 * | 8/2002 | Farrow et al. .............. 438/401 |

OTHER PUBLICATIONS

Encycopedia of Chemical Technology, Kirk-Othmer, vol. 14, pp. 677-709 (1995).

* cited by examiner

*Primary Examiner*—Marcos D. Pizarro
(74) *Attorney, Agent, or Firm*—Evan Law Group LLC

(57) ABSTRACT

A semiconductor structure including a semiconductor substrate, an isolation trench in the semiconductor substrate, and an alignment trench in the semiconductor substrate is disclosed. The structure also includes a dielectric layer and a metallic layer. The dielectric layer is on the semiconductor substrate and in both the isolation trench and the alignment trench. The dielectric layer fills the isolation trench and does not fill the alignment trench. The metallic layer is on the dielectric layer.

16 Claims, 4 Drawing Sheets

SEMICONDUCTOR STRUCTURE HAVING ALIGNMENT MARKS WITH SHALLOW TRENCH ISOLATION

This application is a divisional application of U.S. application Ser. No. 10/321,965 filed Dec. 17, 2002, now U.S. Pat. No. 6,774,452 hereby incorporated by reference.

BACKGROUND

The present invention relates to the field of semiconductor processing, and more specifically to methods and apparatuses utilized in the formation of alignment marks during the fabrication of semiconductor devices.

In semiconductor integrated circuit (IC) fabrication processes, multiple layers of conductors and insulators are patterned and built one upon the other to construct the integrated circuit. During the fabrication process it is critical to align each subsequent layer to a previous layer with great precision in order to preserve circuit continuity. The degree of alignment precision is often a major factor which determines the manufacturability, yield, and profit of a process.

The alignment of one layer to the next is typically accomplished in a tool called a wafer stepper. The purpose of the stepper is to transfer a desired pattern situated on a reticle into a layer formed on the semiconductor wafer. The reticle typically contains a magnified version of the pattern to be generated. Generally, a semiconductor wafer, having an alignment mark, is coated with a transparent photosensitive material, referred to as photoresist. The wafer is then loaded into the wafer stepper tool. The stepper uses the alignment mark on the wafer as a reference point in adjusting the position of the reticle over the wafer to precisely align the reticle to the previous layer on the wafer.

Generally, a stepper utilizes a laser beam with a fixed wavelength to sense the position of the alignment mark on the wafer. The laser beam in the stepper is bounced off of the alignment mark on the semiconductor wafer surface to create a pattern of laser light. The diffraction from the alignment mark is reflected back to sensing devices in the stepper and is used as a signal to measure the exact position of the alignment mark. The quality of the defractive light from the alignment mark is a direct result of the structure of the alignment mark (i.e., a result of the materials and dimensions of the mark).

General problems associated with present techniques of generating alignment marks and aligning wafers are illustrated in FIGS. 1A–1G. As shown in FIG. 1A, individual integrated circuits 122 are generated in each stepping field of the stepper. Generally there are two blank stepping fields 120 which are skipped during alignment and exposure of the various reticles used to pattern the wafer. An alignment mark 102 is typically formed near the center of each blank stepping field 120. Alignment mark 102 is very small in relationship to the blank stepping field 120.

An alignment mark 102 is generally formed by etching a controlled depth into the semiconductor wafer 100, as shown in FIG. 1B. The etching step forms a step height 104 in the wafer 100. The step height 104 acts as the alignment mark. The step height 104, or depth, of alignment mark 102 is generally chosen to be some multiple, typically between ⅛ and ¼, of the wavelength of the laser light used by the stepper to conduct alignment. By utilizing an alignment mark at this multiple of the laser wavelength, the signal to noise ratio of the laser defraction is optimized, resulting in optimum alignment precision.

Next, as shown as FIG. 1C, isolation trenches 106 are formed in the wafer 100 and subsequent layers used to form the integrated circuit 122 are formed over the wafer 100. For example, etch-stop layer 107 and dielectric layer 108 are formed over the semiconductor wafer 100. Although the original alignment mark 102 is covered by subsequent layers, the step height and the therefore, the alignment mark 102, is replicated in the subsequently deposited layers. The replicated alignment marks are used for aligning and patterning the subsequent layers. That is, as more layers are added to the integrated circuit, the step height of the alignment mark 102 is propagated upward or is "built upward" with subsequent layers. The step height of the alignment mark 102 is therefore preserved in subsequent layers so that alignment of subsequent layers can be accomplished.

A problem with building up the alignment mark 102 is that it is incompatible with global planarization techniques, such as chemical-mechanical polishing. As more and more layers are added to the integrated circuit process, and circuit density increases, the requirement to planarize the integrated circuit topography at intermediate steps in the process becomes essential. It is important to planarize surfaces of multilevel integrated circuits because nonplanar surfaces interfere with the optical resolution of subsequent photolithography processing steps. This makes it extremely difficult to print high resolution lines. Additionally, nonplanar surface topographies can affect subsequently formed metal layers. If a step height is too large, there is a serious danger that open circuits will be formed in later metal layers. It has been found that the best way to planarize the integrated circuit topography is to planarize the dielectric layer 108 and to use a global planarization technique, such as chemical-mechanical polishing. Global planarization techniques planarize the entire wafer surface and make the surface essentially flat. Unfortunately, if the dielectric layer 108 is globally planarized, not only is the dielectric layer 108 over the integrated circuit area planarized, but so is the dielectric layer 108 over the alignment mark 102. The global planarization technique, therefore, removes the alignment mark 102 replicated in the dielectric layer 108, as shown in FIG. 1D.

The next step in the fabrication of integrated circuits typically is the formation of a gate layer 110. As shown in FIG. 1E, the gate layer 110 is formed over the dielectric layer 108. Although the alignment mark 102 has been removed during the global planarization step, the formation of the gate layer 110 and the next step, which is typically the formation of metal interconnects, can still proceed because a step caused by the alignment mark 102 is still visible through the transparent dielectric layer 108 and the gate layer 110. That is, the metal interconnects pattern can be aligned to the step height formed in the etch-stop layer 107.

The next step in the fabrication of integrated circuits typically is the formation of metal interconnects. As shown in FIG. 1E, a metallic layer 112 is formed over the gate layer 110 so that an electrical connection can be made. Because metallic layers are opaque, the step height of the alignment mark 102 formed in the etch-stop layer 107 is invisible to the stepper laser once the metallic layer 112 is formed. Without a visible alignment mark or an alignment mark replicated in metallic layer 112, it is impossible to align the reticle to perform subsequent steps.

One solution to the planarized alignment mark problem is an "open frame" process. In an open frame process, after contact alignment, a separate reticle is used to expose the area immediately surrounding alignment mark 102. Dielectric layer 108 over alignment mark 102 can then be etched away. Gate layer 110 and metal layer 112 can then be formed over an uncovered alignment mark 102 formed in the etch-stop layer 107, as shown in FIG. 1F. Alignment mark 102 replicated in metal layer 112 can then be used to align the reticle to generate of the metal interconnect pattern. Alternatively, the open frame process is carried out after gate and metal layer deposition. This process removes these layers from the alignment mark region.

The "open frame" solution works fine in processes that require only one global planarization step. Many integrated circuit processes, however, require two global planarization steps. When a second global planarization step is required, it is difficult to repeat the open frame alignment etch, due to the increased thickness of the dielectric material over the alignment mark. That is after the second global planarization, the depth of the dielectric material over the alignment mark is increased by the depth of the original open frame etch in comparison to the relevant structures on the integrated circuit.

Another solution to the planarized alignment mark problem, as shown in FIG. 1G, is to form a second completely independent alignment mark in the dielectric layer 108. In this process, after global planarization and contact formation, an exclusive masking and etching step is used to form a new alignment mark in the dielectric layer 108. This process requires considerable additional processing which adds no new value to the fabricated integrated circuit. This technique, therefore, is expensive. Also, there may be some misalignment between the two alignment marks.

Thus, what is required is a method of fabricating an alignment mark during multilayer semiconductor processes which is compatible with global planarization techniques, such as chemical-mechanical polishing (CMP) and which does not add additional cost or complexity to the fabrication process.

BRIEF SUMMARY

According to one aspect of the present invention, a semiconductor structure is provided. The structure includes a semiconductor substrate, an isolation trench in the semiconductor substrate, and an alignment trench in the semiconductor substrate. The structure also includes a dielectric layer and a metallic layer. The dielectric layer is on the semiconductor substrate and in both the isolation trench and the alignment trench. The dielectric layer fills the isolation trench and does not fill the alignment trench. The metallic layer is on the dielectric layer.

According to another aspect of the present invention, a method of making a semiconductor structure is provided. The method includes forming an isolation trench in a semiconductor substrate. The forming of the isolation trench does not increase a depth of an alignment trench in the semiconductor substrate. Additionally, a depth of the isolation trench is less than the depth of the alignment trench.

According to another aspect of the present invention, a method of making a semiconductor structure is provided. The method includes depositing a dielectric layer on a semiconductor substrate. The substrate includes an alignment trench and an isolation trench. Additionally, the depositing of the dielectric layer is sufficient to fill the isolation trench, but not sufficient to fill the alignment trench.

Figure 1A:
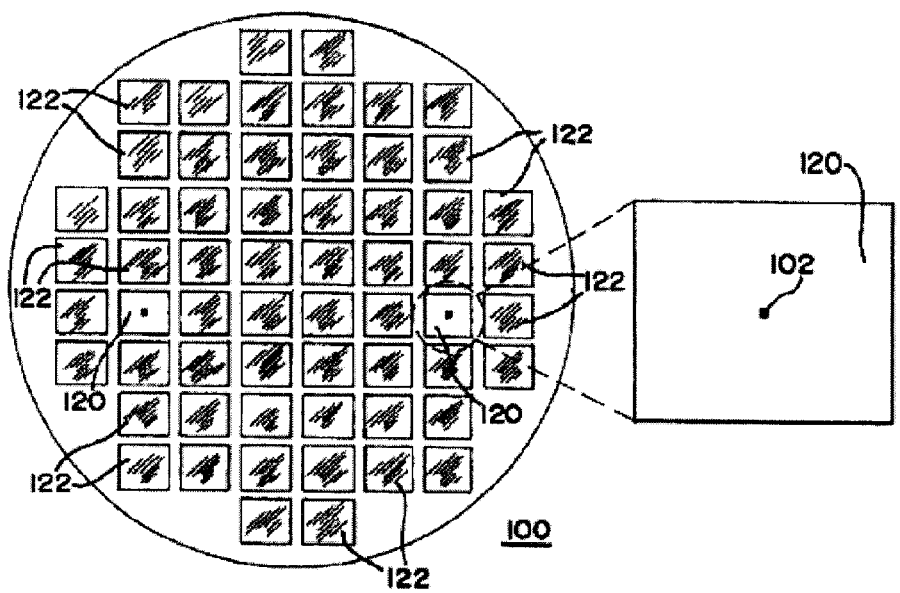
FIG. 1A is an illustration of an overhead view of a semiconductor wafer.
Figure 1B:
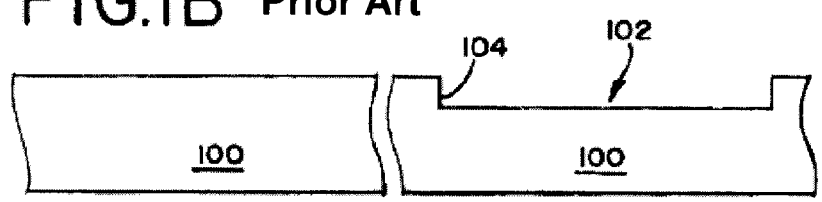
FIGS. 1B–1E illustrate, in cross-section, conventional process steps for the fabrication of a semiconductor structure with alignment marks.
Figure 1C:
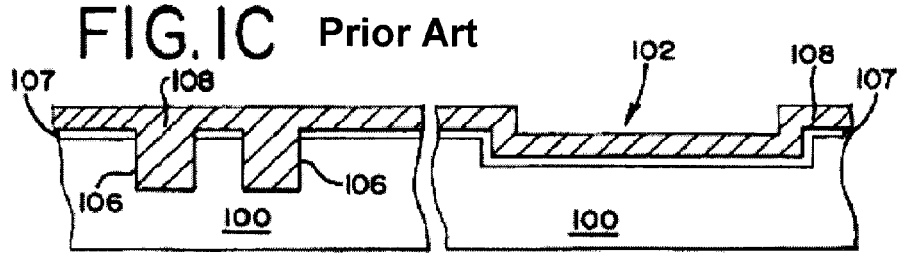
Figure 1D:
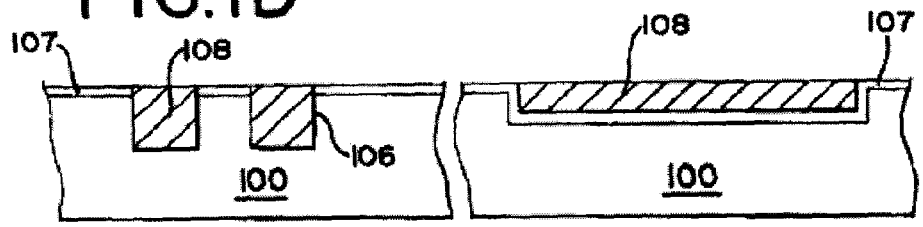
Figure 1E:
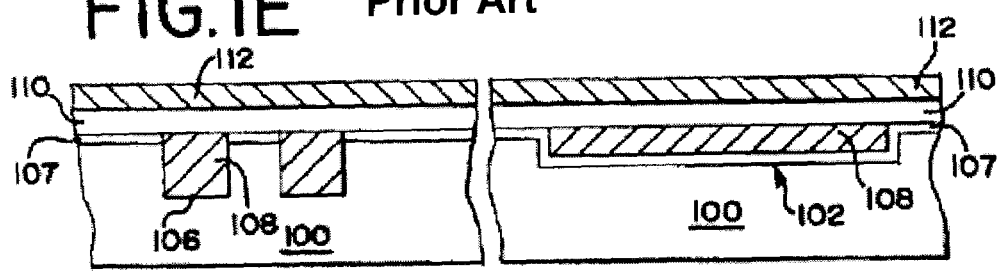
Figure 1F:
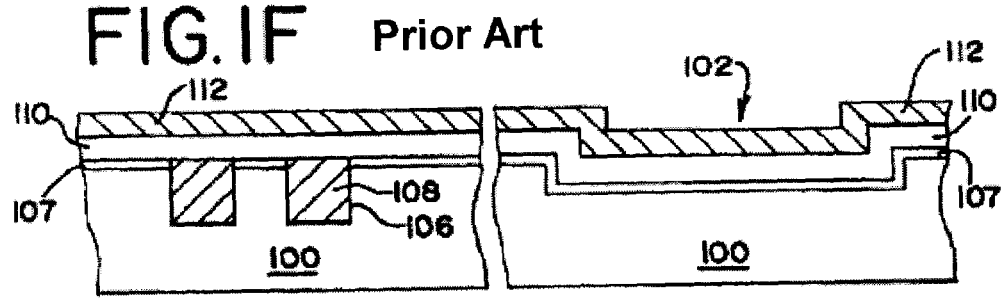
FIG. 1F illustrates, in cross-section, an alternate process step for the fabrication of the semiconductor structure with alignment marks in FIG. 1e.
Figure 1G:
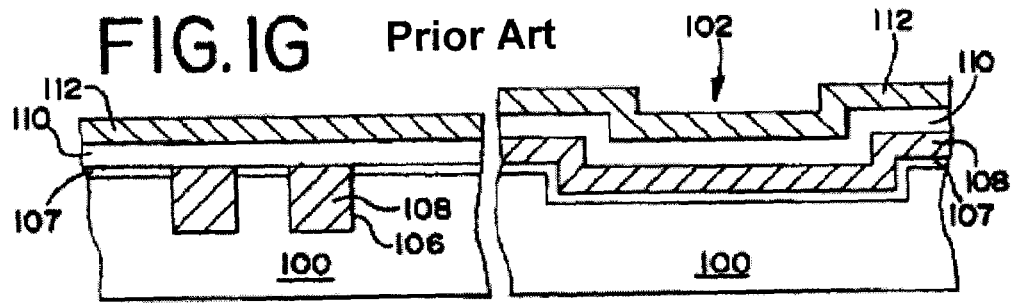
FIG. 1G illustrates, in cross-section, an alternate process step for the fabrication of the semiconductor structure with alignment marks in FIG. 1e.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

The present invention describes a method of forming an alignment mark, or alignment trench, during the processing of a semiconductor wafer into integrated circuits or devices. The alignment trench is prepared separately from the isolation trench, allowing the depths of the alignment trench and the isolation trench to be separately controlled. Furthermore, by making the alignment trench deep enough so that it is not filled by dielectric formed in the isolation trench, the alignment trench is allowed to be translated into subsequent layers. Moreover, etching, after chemical-mechanical polishing of the dielectric layer but before the formation of an opaque metallic layer, is not necessary to insure translation of the alignment mark into the upper layers.

The present invention is most useful for those processes used to form advanced multilevel ultra-large scale integrated (ULSI) circuits where global planarization techniques, such as chemical-mechanical polishing, are utilized. The present invention is illustrated with respect to a specific exemplary portion of a semiconductor process. The present invention, however, is not intended to be limited to the specific example, process, or materials described herein and is applicable to all processes used to form modern high density, multilevel integrated circuits irrespective of the number of layers formed or materials used.

Figure 2A:
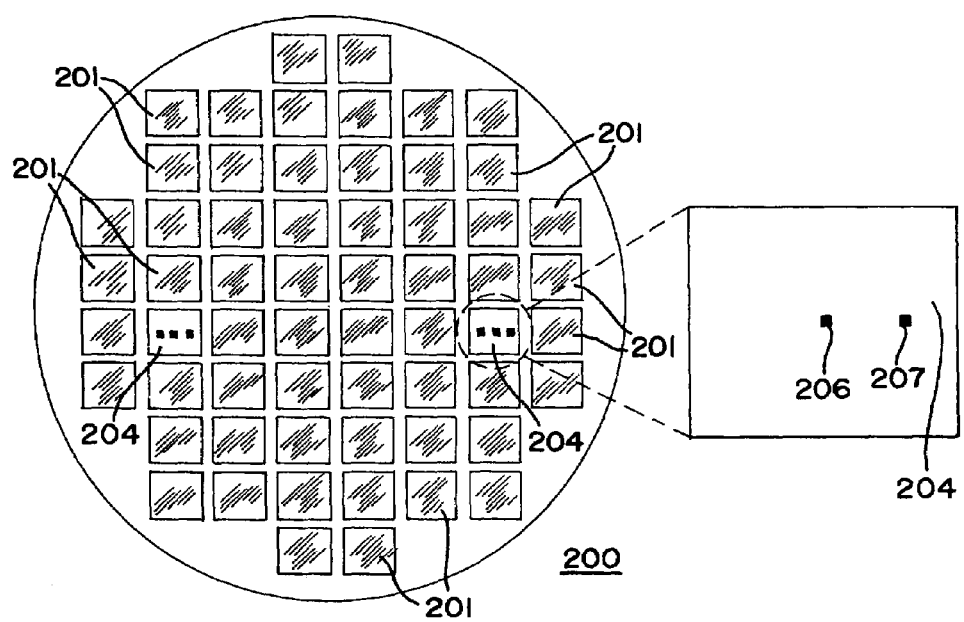
FIG. 2A is an illustration of an overhead view of a processed semiconductor substrate, in accordance with the present invention.
Figure 2B:
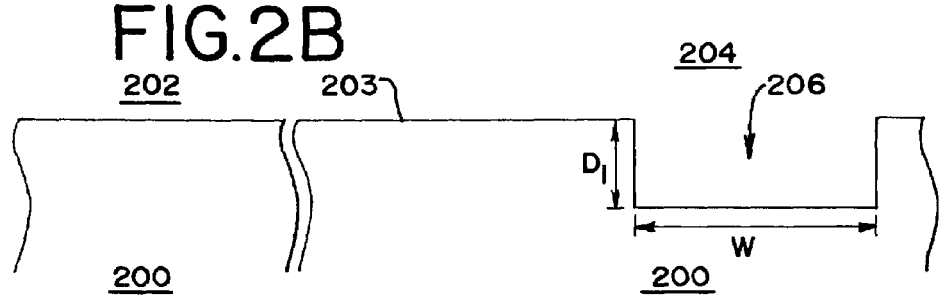
FIGS. 2B–2G illustrate, in cross-section, process steps for the fabrication of a semiconductor structure with alignment marks, in accordance with the present invention.

FIG. 2A is an overhead illustration of a processed semiconductor substrate or wafer 200 of the present invention. Preferably, the semiconductor substrate 200 comprises a single crystal silicon substrate, however, semiconductor substrate 200 may comprise other materials. In one embodiment, semiconductor substrate 202 has principal surface 203 previously processed and cleaned to remove debris and native oxides, as illustrated in FIG. 2B. Substrate 200 is divided in an integrated circuit region 202 and an alignment region 204. Preferably, the integrated circuit region 202 will have a plurality of devices or integrated circuits 201, formed thereon while the alignment region 204 has an alignment mark or trench 206 formed in the substrate 200. Each integrated circuit die lies within a stepping field, or alignment region, of a stepper which generates the patterns, such an alignment mark or trench, on the substrate 200 used to form integrated circuit layers. Substrate 200 also has at least one, and typically two, blank alignment regions 204. A blank alignment region 204 is an area on substrate 200 which is skipped when the stepper forms patterns over the integrated circuit areas of substrate 200. Typically, no semiconductor devices or circuits are formed in the blank alignment region 204.

Formed within each blank alignment regions 204 of substrate 200, as shown in FIG. 2A, is an alignment trench 206. The alignment trench 206 is used by the stepper to align reticles to substrate 200 during the semiconductor fabrication process. The alignment trench 206 is formed in a first layer of the semiconductor substrate 200. Additional alignment trenches 207 may also be formed in blank alignment region 204, according to the present invention. The number of additional alignment trenches will vary depending upon specific process requirements, such as the number of levels of interconnects and the number of planarization steps.

FIG. 2B is a cross section of a semiconductor substrate 200 before any device processing. FIG. 2B shows a portion of an integrated circuit region 202 where active devices are built and a portion of the alignment region 204. One of the first steps in fabricating a semiconductor device is to form an alignment trench, such as alignment trench 206, in alignment region 204 of substrate 200. Alignment trench 206 has a fixed step height or depth $D_1$ etched into the substrate 200, as illustrated in FIG. 2B. The depth $D_1$ of alignment mark 206 is determined by the requirements of the actual stepper utilized. The depth $D_1$ of alignment mark 206 is chosen to be approximately between ⅛ and ¼ multiple of the wavelength of the light (laser) used by the stepper to align a reticle to substrate 200. The depth $D_1$ of alignment mark 206 is chosen so that the signal to noise ratio of light defraction is optimized, resulting in an optimum alignment precision.

In the present invention, alignment trench 206 has a preferred depth $D_1$ of 3000 to 10,000 angstroms, more preferably of 4000 to 8000 angstroms, and most preferably of 4500 to 6000 angstroms. Preferably, the alignment trench 206 has a width of 2 to 15 microns. The alignment trench 206 is preferably formed by masking and etching substrate 200 to a controlled depth. It is to be appreciated that other well-known techniques may be utilized to form alignment trench 206, such as, but not limited to, etching a film of a controlled thickness and stopping on the underlying layer, or etching a film which masks the growth of a subsequent layer.

Figure 2C:
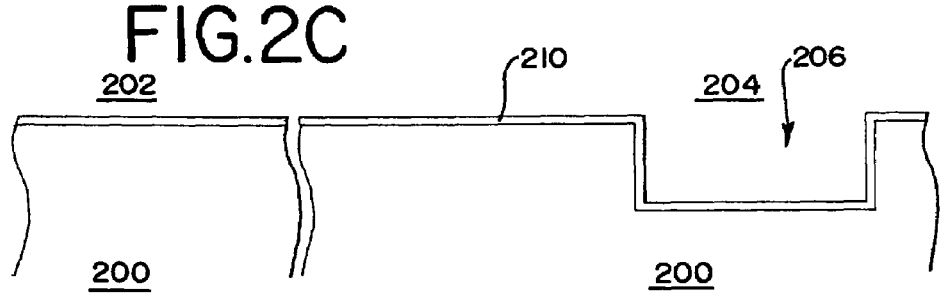
Figure 2D:
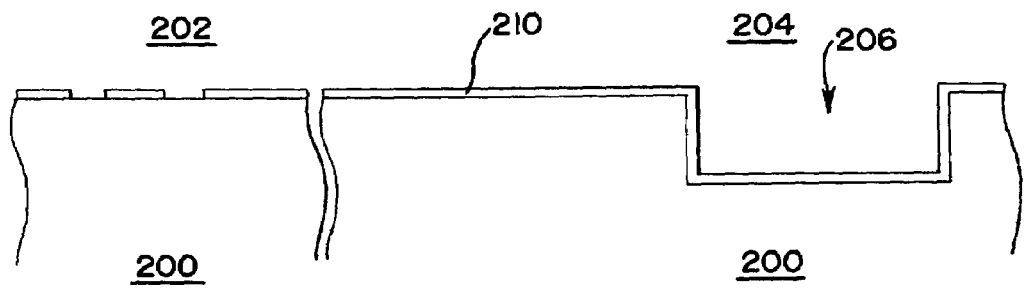

The next step in the fabrication of an integrated circuit typically is the deposition of an etch-stop layer 210 on the semiconductor substrate 200, as illustrated in FIG. 2C. Preferably, the etch-stop layer 210 comprises nitride. Preferably, the etch-stop layer 230 is blanket deposited with well-known techniques, such as chemical vapor deposition (CVD), over the entire surface of substrate 200. Upon depositing the etch-stop layer 210, the etch-stop layer is then patterned, as illustrated in FIG. 2D.

Figure 2E:
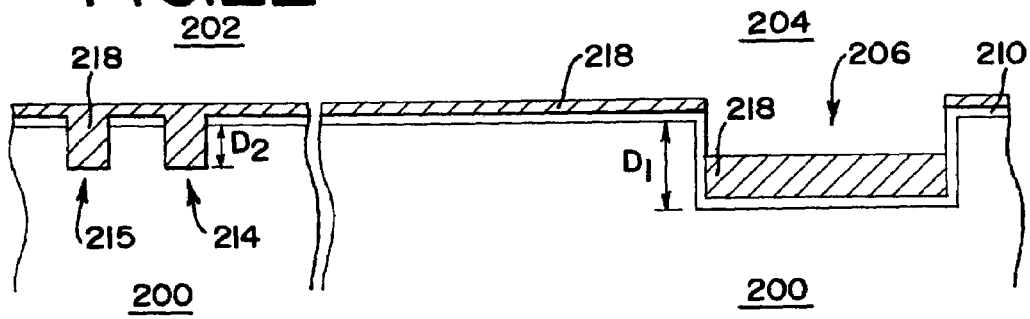

Upon depositing and patterning the etch-stop layer 210, an isolation trench 214 is formed, as illustrated in FIG. 2E. Isolation trench 214 has a fixed step height or depth $D_2$ etched into the substrate 200. The depth $D_2$ of the isolation trench 214 is determined by the requirements of the integrated circuit 201. In the present invention, isolation trench 214 has a preferred depth $D_2$ of 1000 to 5000 angstroms, more preferably of 2000 to 4000 angstroms, and most preferably of 3000 to 3500 angstroms. Preferably, the isolation trench 214 has a depth $D_2$ that is less than the depth $D_1$ of the alignment trench 206. The isolation trench 214 is preferably formed by masking and etching substrate 200 to a controlled depth. Additional isolation trenches 215 may also be formed in integrated circuit regions 202, according to the present invention. The number of additional isolation trenches will vary depending upon specific process requirements.

Upon forming the isolation trench 214, a dielectric layer 218 is formed on the semiconductor substrate 200, as illustrated in FIG. 2E. Preferably, the dielectric layer 218 includes a dielectric material, such as oxide, however the dielectric layer 218 may include any dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon nitride, silicon oxide, P-doped silicon oxide (P-glass), and low k dielectric materials (such as F-doped silicon oxide), for example $SiO_2$, $Si_3N_4$, $Al_2O_3$, $SiO_xN_y$, $Ta_2O_5$, $TiO_2$, etc. The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt % of phosphorous and 0–8 wt % of boron). Preferably, the dielectric layer 218 is formed from $SiO_2$ or $Si_3N_4$. In one embodiment, the dielectric layer 218 is deposited by chemical vapor deposition. The dielectric layer 218 electrically isolates the various components formed in integrated circuit region 202. Preferably, the dielectric layer 218 is deposited in an amount sufficient to fill the isolation trench 214, but not sufficient to fill the alignment trench 206.

As defined herein, the phrase "sufficient to fill the isolation trench" means to deposit an amount of material sufficient to cover up the isolation trench 214 so that the surface above the isolation trench 214 does not travel below the principal surface 203 of the semiconductor substrate 200, as illustrated in FIG. 2E. Similarly, as defined herein, the phrase "not sufficient to fill the alignment trench" means to deposit an amount of material which is not sufficient to cover up the alignment trench 206, so that the surface above the alignment trench 206 does travel below the principal surface 203 of the semiconductor substrate 200, as illustrated in FIG. 2E.

Figure 2F:
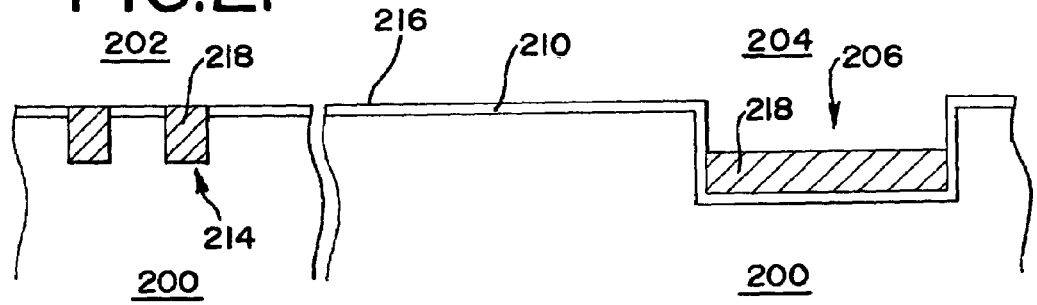

Upon depositing the dielectric layer 218, the dielectric layer 218 is globally planarized, for example by chemical-mechanical polishing, to form a sufficiently flat surface 216, as shown in FIG. 2F. It is to be appreciated that since the dielectric layer 218 is deposited in an amount sufficient to fill the isolation trench 214, but not sufficient to fill the alignment trench 206, the alignment trench 206 is preserved even after the dielectric layer 218 is globally planarized. Since the alignment trench 206 is not removed, the alignment trench 206 may be used to align additional layers that are deposited onto the semiconductor substrate 200. Preferably, The dielectric layer 218 is planarized down to the initial etch-stop layer 210, but not down to the princiapl surface 203 of the semiconductor substrate 200.

Figure 2G:
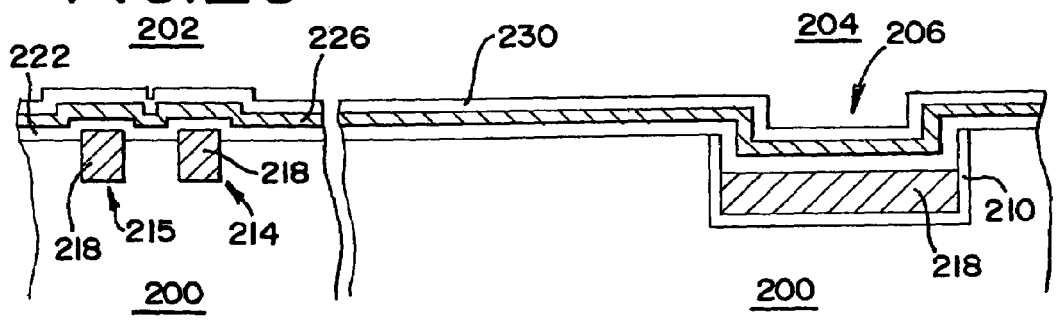

Next, a gate layer 222 is formed, as illustrated in FIG. 2G. The gate layer 222 is preferably formed from polysilicon, but may include any metallic or conductive material, such as metals and alloys, doped semiconductors, and metallic compounds. Examples of metals and alloys include Al, Cu, Au, Ag, W, Ti, Zr, Mo, Pt, Ir, Pd, Mg, Ta, Nb, Cr, Ni, and alloys thereof. Doped semiconductors include Si, Ge, SiGe, and mixture and alloys thereof; III-V semiconductors such as GaAs and InP, and mixtures and alloys thereof; and II-VI semiconductors such as ZnO and CdS, and mixtures and alloys thereof. Examples of metallic compounds include nitrides such as TiN, TaN, NbN, ZrN, MoN and WN; silicides such as WSi, TiSi$_2$, and MoSi$_2$; oxides such as TiO$_x$ and ZrO$_x$; and mixtures and alloys thereof. Preferably, the gate layer 222 is blanket deposited with well-known techniques, such as chemical vapor deposition (CVD) or sputtering, over the entire surface of substrate 200. The alignment trench 206 is substantially replicated in the gate layer 222.

After the gate layer 222 is formed, optionally a metallic layer 226 is formed, as illustrated in FIG. 2G. The metallic layer 226 is preferably formed from conductive material, such as tungsten, titanium, or titanium nitride, but may contain other conductive materials including aluminum, gold, copper, tantalum, or alloys or compounds thereof. Preferably, the metallic layer 226 is blanket deposited with well-known techniques, such as chemical vapor deposition (CVD), physical vapor deposition (PVD) of the metal, low pressure chemical vapor deposition (LPCVD) of a mixture of a metal halide and hydrogen, or sputtering over the entire surface of substrate 200. The alignment trench 206 is substantially replicated in the metallic layer 226. Preferably, the alignment trench 206 is used by the stepper to align reticles to substrate 200 during the semiconductor fabrication process of the gate layer 222, the metallic layer 226, and any subsequent layers, such as etch-stop layer 230.

Upon depositing the metallic layer 226, an etch-stop layer 230 is deposited on the semiconductor substrate 200, as illustrated in FIG. 2G. Preferably, the etch-stop layer 210 comprises nitride. Preferably, the etch-stop layer 230 is blanket deposited with well-known techniques, such as chemical vapor deposition (CVD) or sputtering, over the entire surface of substrate 200. The alignment trench 206 is substantially replicated in the etch-stop layer 230.

The individual semiconductor processing steps used in accordance with the present invention (e.g., CVD, etc.) are well known to those of ordinary skill in the art, and are also described in numerous publications and treatises, including: *Encyclopedia of Chemical Technology*, Volume 14 (Kirk-Othmer, 1995, pp. 677–709); *Semiconductor Device Fundamentals* by Robert F. Pierret (Addison-Wesley, 1996); *Silicon Processing for the VLSI Era* by Wolf (Lattice Press, 1986, 1990, 1995, vols 1–3, respectively); and *Microchip Fabrication: A Practical Guide to Semiconductor Processing* by Peter Van Zant (4$^{th}$ Edition, McGraw-Hill, 2000).

Numerous additional variations in the presently preferred embodiments illustrated herein will be determined by one of ordinary skill in the art, and remain within the scope of the appended claims and their equivalents. For example, while the examples provided above relate to silicon-based semiconductor substrates, it is contemplated that alternative semiconductor materials can likewise be employed in accordance with the present invention, and that the semiconductor substrates may be undoped, P-doped, or N-doped. Suitable semiconductor materials include but are not limited to silicon, gallium arsenide, germanium, gallium nitride, aluminum phosphide, $Si_{1-x}Ge_x$ and $Al_xGa_{1-x}As$ alloys, wherein x is greater than or equal to zero and less than or equal to one, the like, and combinations thereof. Additional examples of semiconductor materials for use in accordance with the present invention are set forth in *Semiconductor Device Fundamentals* by Robert F. Pierret (p. 4, Table 1.1, Addison-Wesley, 1996).

Furthermore, a semiconductor structure produced in accordance with and embodying features of the present invention can undergo additional processing in order to produce semiconductor devices and electronic devices incorporating such semiconductor devices. For example, additional source/drain regions, gates, gate dielectric layers, and the like can be formed on the semiconductor substrate to make transistors, which may be connected together through dielectric layers by contacts and metallization layers. Such additional elements may be formed before, during, or after formation of the previously described structures.

Semiconductor structures embodying features of and produced in accordance with the present invention may be incorporated into a great variety of semiconductor devices, including integrated circuits (e.g., memory cells such as SRAM, DRAM, EPROM, EEPROM, and the like), programmable logic devices, data communications devices, clock generation devices, and so forth. Furthermore, any of these semiconductor devices may itself be incorporated into a multitude of electronic devices, including computers, automobiles, airplanes, satellites, and the like.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

The invention claimed is:

1. A method of making a semiconductor structure, comprising:
    forming an isolation trench in a semiconductor substrate; and
    depositing a dielectric layer on the semiconductor substrate;
    wherein the forming of the isolation trench does not increase a depth of an alignment trench in the semiconductor substrate,
    a depth of the isolation trench is less than the depth of the alignment trench,
    the depositing of the dielectric layer is sufficient to fill the isolation trench, but not sufficient to fill the alignment trench, and
    the isolation trench is formed in an integrated circuit region of the semiconductor substrate, the alignment trench is formed in an alignment region of the semiconductor substrate, and the integrated circuit region and the alignment region are at the same height.

2. A method of making a semiconductor structure, comprising:
    forming an isolation trench in a semiconductor substrate,
    wherein the forming of the isolation trench does not increase a depth of an alignment trench in the semiconductor substrate,
    a depth of the isolation trench is less than the depth of the alignment trench,
    the isolation trench and the alignment trench are formed in a principal surface of the semiconductor substrate, and
    the principal surface is a flat surface.

3. The method of claim 2, wherein the isolation trench is formed in an integrated circuit region of the semiconductor substrate, the alignment trench is formed in an alignment region of the semiconductor substrate, and the integrated circuit region and the alignment region are at the same height.

4. The method of claim 2, further comprising depositing a dielectric layer on the semiconductor substrate.

5. The method of claim 4, wherein the depositing of the dielectric layer is sufficient to fill the isolation trench, but not sufficient to fill the alignment trench.

6. The method of claim 4, further comprising planarizing the dielectric layer.

7. The method of claim 6, further comprising depositing a metallic layer on the dielectric layer after the planarizing.

8. A method of making a semiconductor structure, comprising:
   forming an isolation trench in a semiconductor substrate; and
   depositing a dielectric layer on the semiconductor substrate;
   wherein the forming of the isolation trench does not increase a depth of an alignment trench in the semiconductor substrate,
   a depth of the isolation trench is less than the depth of the alignment trench,
   the depositing of the dielectric layer is sufficient to fill the isolation trench, but not sufficient to fill the alignment trench, and
   the isolation trench and the alignment trench are formed in a principal surface of the semiconductor substrate, and the principal surface is a flat surface.

9. A method of making a semiconductor device, comprising:
   forming a semiconductor structure by the method of claim 8, and
   forming a semiconductor device from the semiconductor structure.

10. A method of making an electronic device, comprising:
    forming a semiconductor device by the method of claim 9, and
    forming an electronic device comprising the semiconductor device.

11. The method of claim 8, further comprising forming a metallic layer on the dielectric layer.

12. The method of claim 11, wherein the dielectric layer is not etched after the planarizing and before the forming of the metallic layer.

13. The method of claim 8, further comprising planarizing the dielectric layer.

14. The method of claim 13, further comprising depositing a metallic layer on the dielectric layer after the planarizing.

15. A method of making a semiconductor device, comprising:
    forming a semiconductor structure by the method of claim 14, and
    forming a semiconductor device from the semiconductor structure.

16. A method of making an electronic device, comprising:
    forming a semiconductor device by the method of claim 15, and
    forming an electronic device comprising the semiconductor device.

* * * * *